(12) United States Patent
Sato et al.

(10) Patent No.: US 6,635,860 B2
(45) Date of Patent: Oct. 21, 2003

(54) RADIATION DETECTOR

(75) Inventors: Kenji Sato, Otsu (JP); Toshinori Yoshimuta, Takatsuki (JP); Satoshi Tokuda, Kusatsu (JP)

(73) Assignee: Shimadzu Corporation, Kyoto (JP)

( * ) Notice: Subject to any disclaimer, the term of this patent is extended or adjusted under 35 U.S.C. 154(b) by 133 days.

(21) Appl. No.: 10/118,293

(22) Filed: Apr. 8, 2002

(65) Prior Publication Data

US 2002/0148949 A1 Oct. 17, 2002

(30) Foreign Application Priority Data

Apr. 12, 2001 (JP) ........................................ 2001-113592

(51) Int. Cl.⁷ ............................................. H01L 31/00
(52) U.S. Cl. ............................ 250/214.1; 250/370.09; 257/72; 257/444
(58) Field of Search .................... 250/214.1, 208.1, 250/370.09, 370.08, 370.01, 370.11, 370.15; 257/72, 444, 443, 431, 429, 428, 448

(56) References Cited

U.S. PATENT DOCUMENTS 5,420,452 A * 5/1995 Tran et al. ................... 257/428
6,392,217 B1 * 5/2002 Teranuma et al. ......... 250/208.1

FOREIGN PATENT DOCUMENTS

| EP | 1009038 A2 * | 6/2000 | ............ H01L/31/08 |
| EP | 1079437 A2 * | 2/2001 | ......... H01L/27/146 |
| JP | 11-240026 | 3/2001 | |
| JP | 2000-191167 | 1/2002 | |

* cited by examiner

*Primary Examiner*—Kevin Pyo
*Assistant Examiner*—Seung C. Sohn
(74) *Attorney, Agent, or Firm*—Rankin, Hill, Porter & Clark LLP (57) ABSTRACT

A solvent-resistant and carrier-selective high-resistance film is formed between a radiation sensitive type amorphous semiconductor thick film, and a voltage application electrode in such a manner as to cover the entire surface of the amorphous semiconductor thick film. Moreover, an insulating auxiliary plate member having a thermal expansion coefficient, which is comparable to that of an insulating substrate, is formed on the surface of the top layer, in which the amorphous semiconductor thick film, the solvent-resistant and carrier-selective high-resistance film, and the voltage application electrode are formed, and fixed thereonto by using a high-withstand-voltage hardening synthetic resin in such a way as to cover the surface of the top layer.

12 Claims, 11 Drawing Sheets

RADIATION DETECTOR

BACKGROUND OF THE INVENTION

1. Field of the Invention

The present invention relates to a direct conversion type radiation detector for use in a medical field, an industrial field, and a nuclear energy field. More particularly, the present invention relates to techniques for improving an environment resistance of a radiation sensitive type semiconductor film in the radiation detector and for suppressing a creeping discharge due to a bias voltage applied to the radiation sensitive type semiconductor film.

2. Description of the Related Art

Detectors for detecting radiation, such as X-rays, include indirect conversion type detectors, and direct conversion type detectors. The indirect conversion type detectors are adapted to first convert radiation into light and then perform photoelectric conversion of the converted light into electric signals. The direct conversion type detectors are adapted to convert incident radiation directly into electrical signals, such as a radiation sensitive type semiconductor film.

In the latter direct conversion type detector, a predetermined bias voltage is applied onto a voltage application electrode formed on a front surface of a radiation sensitive type semiconductor film. A carrier collection electrode is formed on a back surface of the semiconductor film and collects carriers, which are generated by radiation irradiation and extracts the collected carriers as a radiation detection signal thereby to perform detection of radiation.

Figure 8:
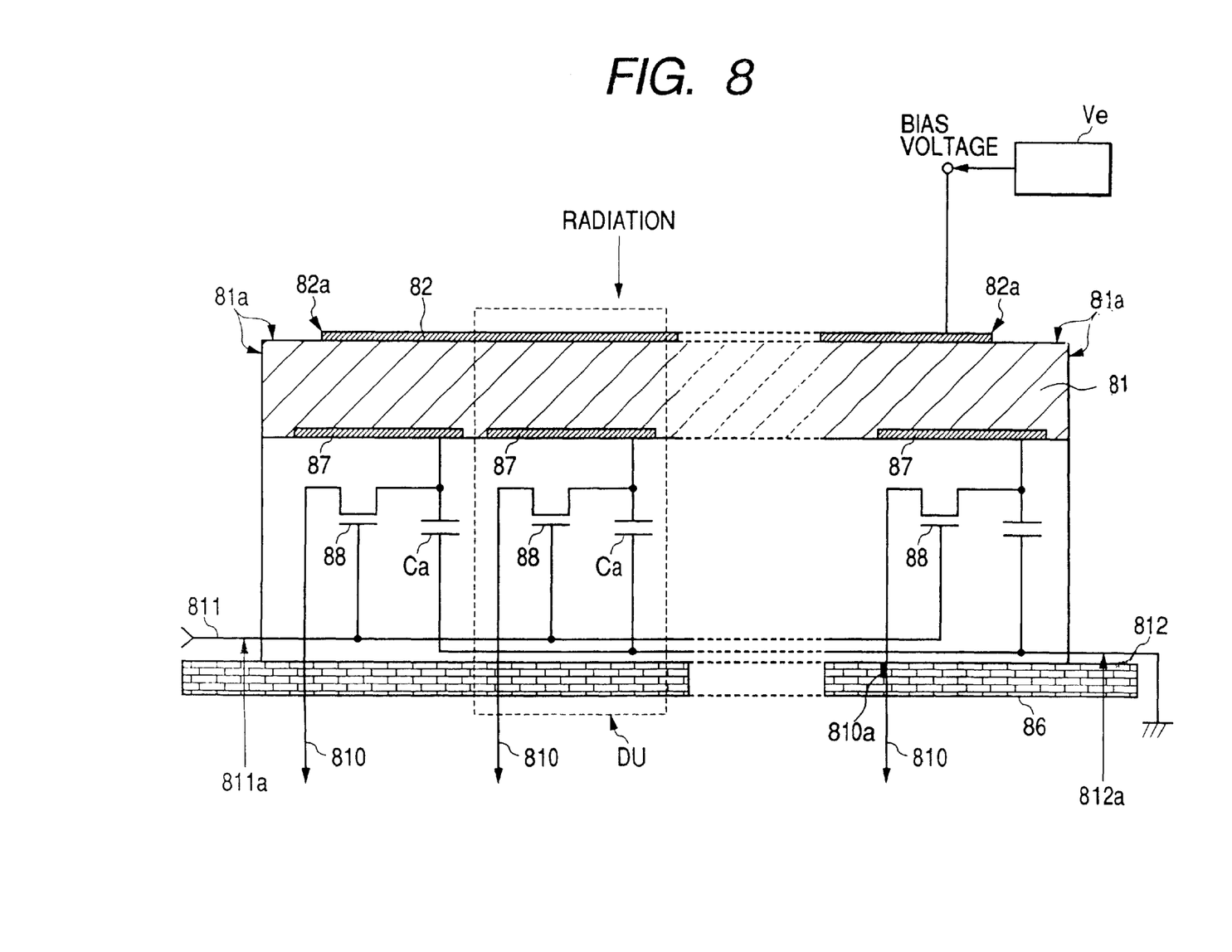
FIG. 8 is a schematic sectional view illustrating a primary part of the configuration of a related art radiation detector.

Further, when a thick film of an amorphous semiconductor, such as amorphous selenium, is used as a radiation sensitive type semiconductor film, a thick and large film of an amorphous semiconductor can easily be formed by a vacuum evaporation method. Thus, the amorphous semiconductor is suitable for constructing a two-dimensional array type radiation detector, which requires a large area thick film, among the related art conversion type radiation detectors As illustrated in FIG. 8, a related art two-dimensional array type radiation detector comprises an insulating substrate 86, an amorphous semiconductor thick film 81 and a voltage application electrode 82. The insulating substrate 86 has plural charge storage capacitors Ca and plural charge-reading switching elements 88, which are formed in a crosswise or two-dimensional matrix-like arrangement thereon. The charge-reading switching element 88 is constituted by thin film transistors and is normally put in an OFF-state. The amorphous semiconductor thick film 81 is electrically connected to the plural charge storage capacitors Ca and formed on the insulating substrate 86 through plural carrier collection electrodes 87. In amorphous semiconductor thick film 81, Charge transfer media (that is, carriers) are generated by incidence of radiation. The voltage application electrode 82 is formed on a surface of the amorphous semiconductor thick film 81. Incidentally, one charge storage capacitor Ca and one charge reading switching element 88 are provided correspondingly to each of the carrier collection electrodes 87. Each set of the charge storage capacitor Ca, the charge reading switching element 88, and the carrier collection electrodes 87 constitutes a detecting element DU serving as a radiation detection unit.

Incidentally, when radiation is irradiated during a state in which a bias voltage is applied to the voltage application electrode 82, the charge transfer media (that is, carriers) generated by incidence of radiation are respectively moved by the bias voltage to the voltage application electrode 82 and the carrier collection electrode 87. Electric charges are stored in the charge storage capacitor Ca according to the number of the generated carriers. The stored charges are read as radiation detection signals by putting the switching element 88 into an ON-state.

When the radiation detector of the two-dimensional array configuration shown in FIG. 8 is used for detecting, for example, an X-ray fluoroscopic image obtained by an X-ray fluoroscopic imaging system, the X-ray fluoroscopic image is obtained according to the radiation detection signal outputted from the radiation detector.

However, in the case of the related art radiation detector, the thermal expansion coefficient of the amorphous semiconductor thick film 81 is large. Thus, there is a danger that thermal warpage occurs owing to the difference in the thermal expansion coefficient between the amorphous semiconductor thick film 81 and the substrate 86. When such warpage occurs, the amorphous semiconductor thick film 81 may crack. In such a case, such cracks may result in image defects. Further, discharge breakdown may occur at a crack portion, and the detector may be brought into an inoperable state.

Furthermore, in the case of the related art radiation detector, as illustrated in FIG. 8, read lines 810, gate lines 811, and ground lines 812 have parts 810a, 811a, and 812a exposed on the insulating substrate 86. Therefore, there is a danger that a creeping discharge is caused by an occurrence of dielectric breakdown in a portion from an end edge 82a of the voltage application electrode 82 along the surface of an end edge 81a of an amorphous semiconductor thick film 81 to the parts 810a, 811a, and 812a. Further, for example, in the case of an X-ray fluoroscopic image, an occurrence of a creeping discharge causes noises of the radiation detection signal. This results in degradation in the picture quality of the image. Creeping discharge can be suppressed by setting the bias voltage at a low value as a countermeasure there against. However, in such a case, the amorphous semiconductor is inferior in carrier transit characteristics to a monocrystalline semiconductor. Thus, the related art radiation detector has encountered a drawback in that the detector cannot obtain sufficient detection sensitivity.

Figure 9:
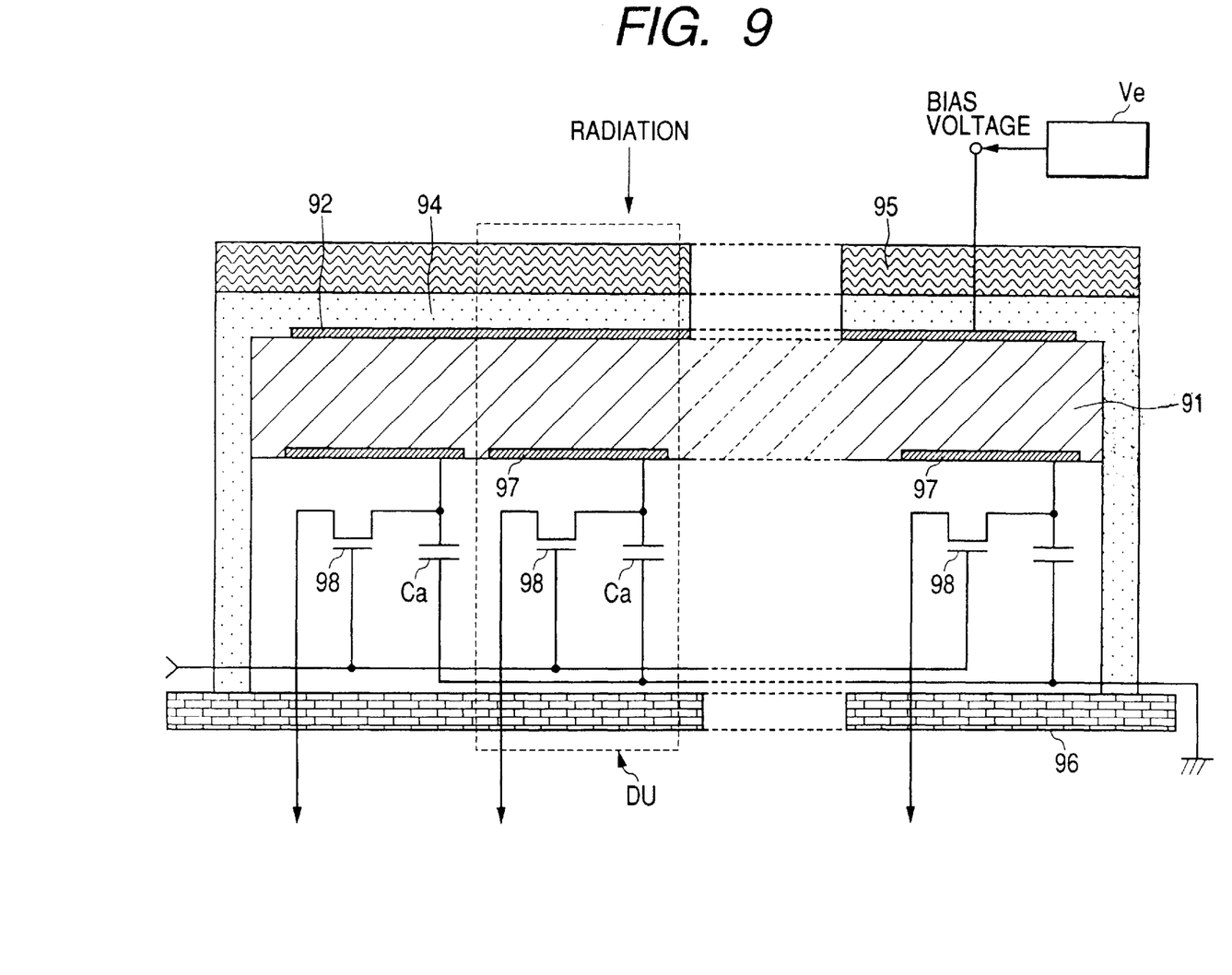
FIG. 9 is a schematic sectional view illustrating a primary part of the configuration of a related art improved radiation detector.

Incidentally, to deal with the problem of the environment resistance, such as that of warpage due to change in temperature, there has been proposed a radiation detector A having an insulating plate member 95 as shown in FIG. 9. The insulating plate member 95 is formed on the surfaces of the top layer of the amorphous semiconductor thick film 91 and the voltage application electrode 92 formed on the insulating substrate 96. The insulating plate member 95 has thermal expansion coefficient which is comparable to that of the insulating substrate 96. The insulating plate member 95 is fixed by a high-withstand-voltage hardening synthetic resin 94 in such a manner as to cover the entire surfaces of the top layer.

Figure 7:
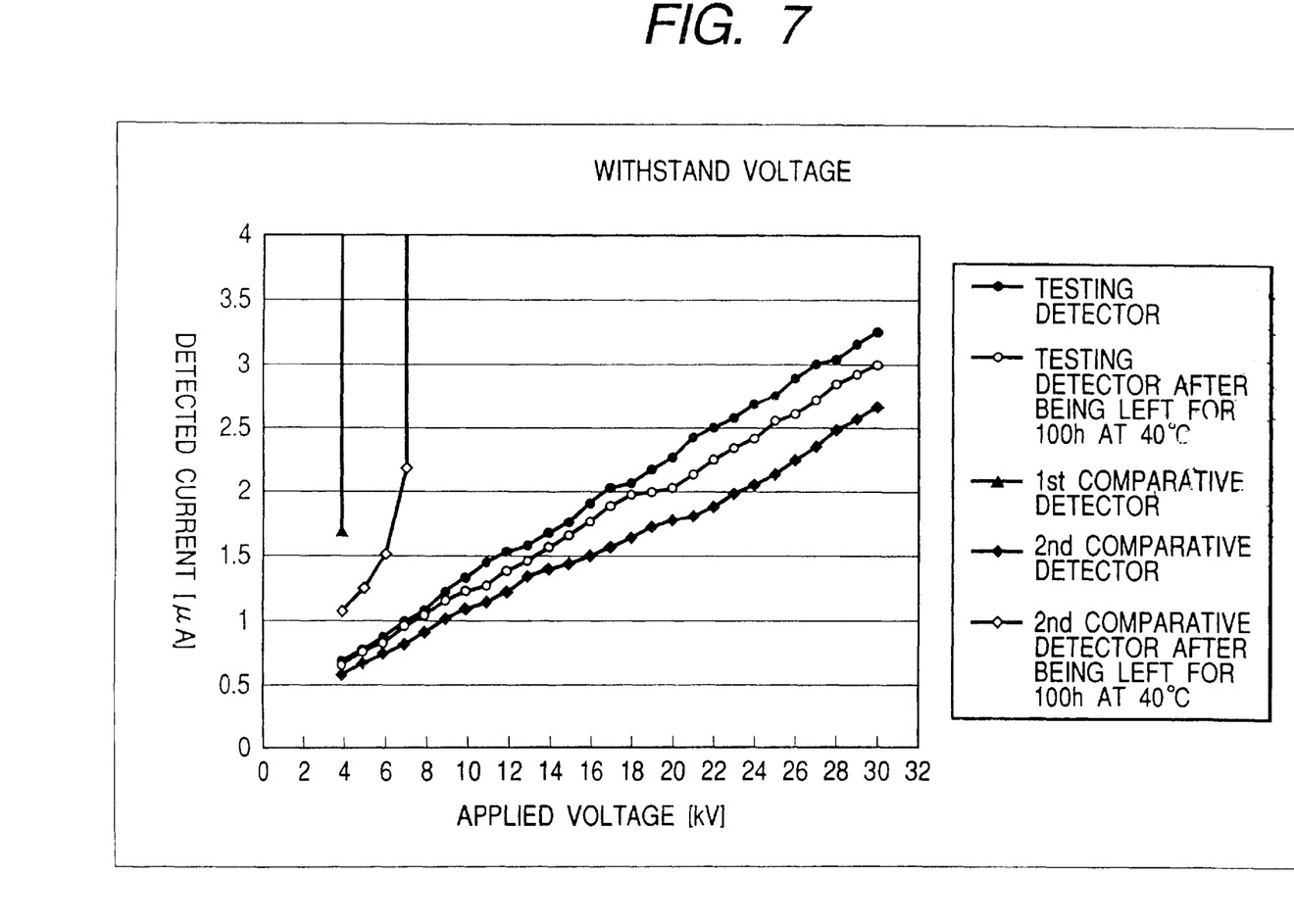
FIG. 7 is a graph illustrating results of measurement of withstand voltages of three radiation detectors, that is, a testing detector, a first comparative detector, and a second comparative detector.

However, in such a radiation detector A, a result of an experiment is obtained, which reveals that the surface of the amorphous semiconductor thick film 91 is deteriorated by a solvent ingredient of the high-withstand-voltage hardening synthetic resin 94, so that a creeping discharge occurs and the withstand voltage lowers (see a result of an experiment corresponding to a first comparative detector, which is shown in FIG. 7).

Figure 10:
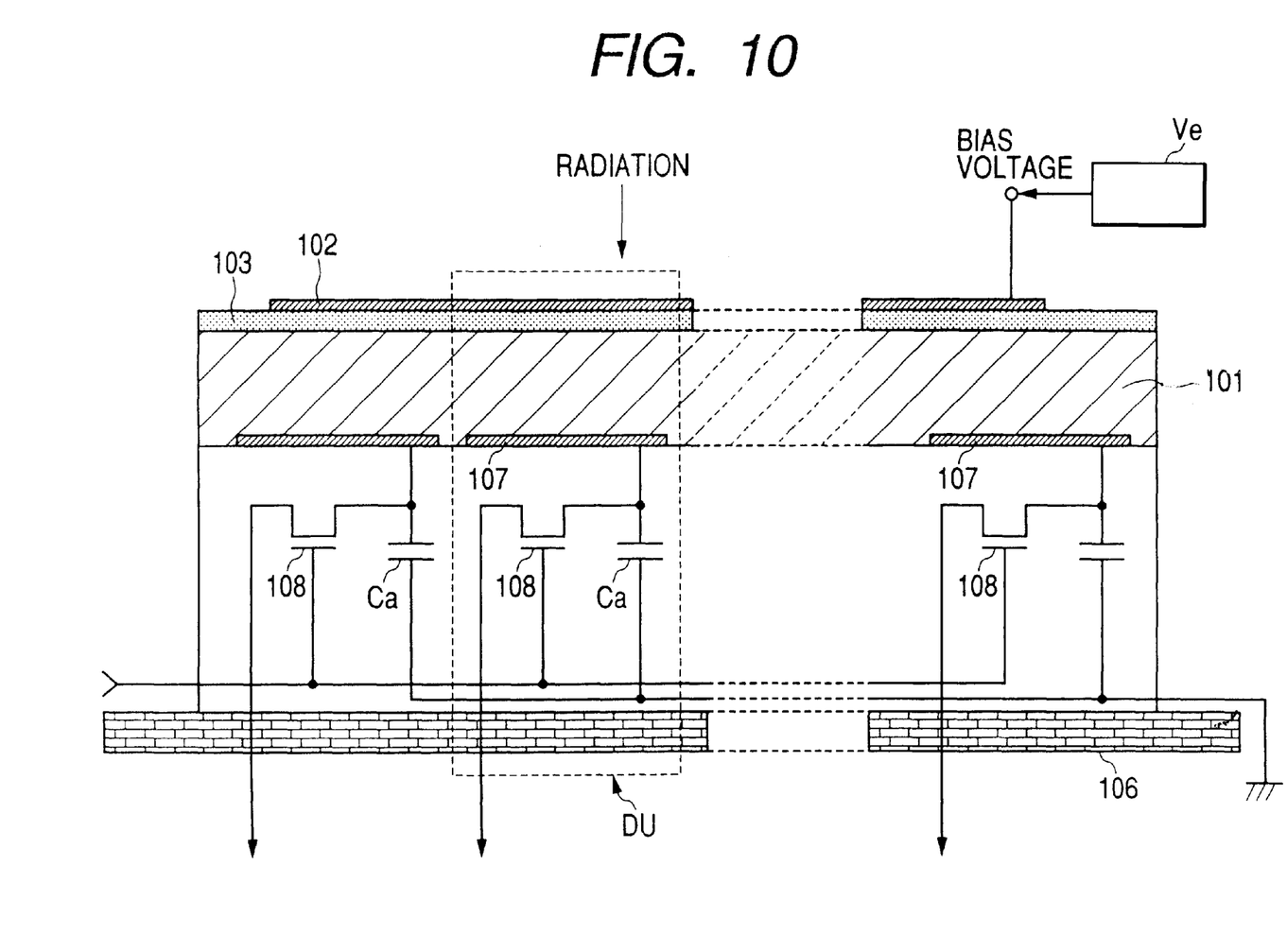
FIG. 10 is a schematic sectional view illustrating a primary part of the configuration of another related art improved radiation detector B.

Moreover, to prevent an occurrence of a creeping discharge, there has been proposed a radiation detector B having a carrier-selective high-resistance film 103 made of a material, such as $Sb_2S_3$, which is formed between an amorphous semiconductor thick film 101 and a voltage application electrode 102, as shown in FIG. 10 (in Japanese Patent Application No. 11-240026). The carrier-selective high-resistance film 103 is formed in such a way as to entirely cover the surface of the amorphous semiconductor thick film 101, which is liable to deteriorate.

However, such a radiation detector B has a drawback in that the carrier-selective high-resistance film 103 made of a material, such as $Sb_2S_3$, is inferior in tensile strength and thus cannot withstand warpage of the amorphous semiconductor thick film 101, which is caused owing to change in temperature, and that cracks are apt to occur. Further, it is difficult for the carrier-selective high-resistance film 103 to have a thickness which is sufficient for preventing an occurrence of a creeping discharge. Incidentally, each of a switching element 108 and a carrier collection electrode 107 shown in FIG. 10 has a structure similar to that of a corresponding one of the switching element 88 and the carrier collection electrode 87 shown in FIG. 8.

Figure 11:
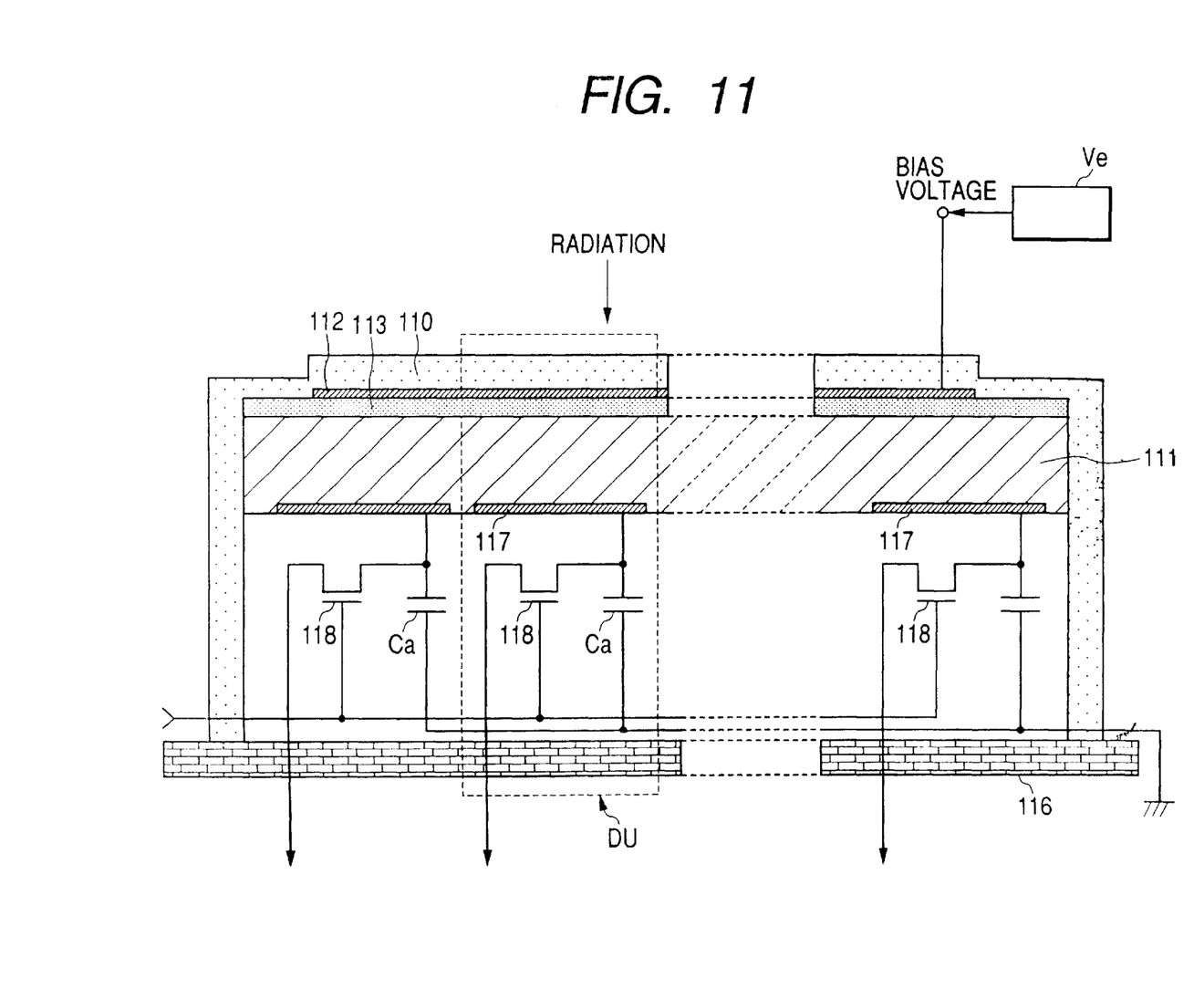
FIG. 11 is a schematic sectional view illustrating a primary part of the configuration of another related art improved radiation detector C.

Furthermore, to prevent an occurrence of a creeping discharge, there has been proposed a radiation detector C having a discharge preventing film 110 made of high-withstand-voltage insulating materials, such as silicon resin and epoxy resin, as shown in FIG. 11 (in Japanese Patent Application No. 2000-191167) The discharge preventing film 110 is formed on the surfaces of the top layer of an amorphous semiconductor thick film 111 and a voltage application electrode 112.

However, in such a radiation detector C, the discharge preventing film 110 made of high-withstand-voltage insulating materials, such as a silicon resin and an epoxy resin, differs in thermal expansion coefficient from and relatively inferior in surface strength to an insulating substrate 116. Thus, similarly, warpage due to change in temperature occurs. Consequently, cracks occur in the resin itself and the interlayer 113 between the amorphous semiconductor thick film 111 and the voltage application electrode 112, so that the detector has an insufficient creeping discharge withstand voltage (see a result of an experiment corresponding to a second comparative detector, which is shown in FIG. 7).

Incidentally, each of a switching element 118 and a carrier collection electrode 117 shown in FIG. 11 has a structure similar to that of a corresponding one of the switching element 88 and the carrier collection electrode 87 shown in FIG. 8.

SUMMARY OF THE INVENTION

In view of the aforementioned circumstances, an object of the invention is to provide a radiation detector that is superior in an environment resistance, such as temperature resistance, and is enabled to prevent an occurrence of a creeping discharge due to a bias voltage applied to a radiation sensitive type semiconductor film and to obtain sufficient detection sensitivity.

To achieve the foregoing object, according to the invention, there is provided a radiation detector (hereunder referred to as a first radiation detector of the invention), which comprises an insulating substrate having a charge storage capacitor and a charge reading switching element which are formed thereon; a carrier collection electrode formed on the insulating substrate and electrically connected to the charge storage capacitor; a radiation sensitive type amorphous semiconductor thick film formed on the carrier collection electrode and adapted to generate charge transfer media in response to an incidence of a radiation; a voltage application electrode formed on the amorphous semiconductor thick film; a solvent-resistant and carrier-selective high-resistance film formed between the amorphous semiconductor thick film and the voltage application electrode in such a manner as to cover the entire surface of the amorphous semiconductor thick film; and an insulating auxiliary plate member having a thermal expansion coefficient, which is comparable to that of the insulating substrate, and being formed on the voltage application electrode and fixed thereto by a high-withstand-voltage hardening synthetic resin in such a way as to prevent warpage of the amorphous semiconductor thick film from occurring owing to change in temperature. In the radiation detector, electric charges are stored in the charge storage capacitor according to the number of the charge transfer media generated in the amorphous semiconductor thick film by the incidence of radiation and the electric charges stored in the charge storage capacitor is read as a radiation detection signal through the switching element.

According to an embodiment (hereunder referred to as a second radiation detector of the invention) of the first radiation detector of the invention, the radiation detector has a two-dimensional array structure in which a plurality of carrier collection electrodes are formed in such away as to be arranged in a two-dimensional matrix-like manner, and one of charge storage capacitors and one of charge reading switching elements are provided correspondingly to each of the carrier collection electrodes.

According to an embodiment (hereunder referred to as a third radiation detector of the invention) of the first radiation detector of the invention, the solvent-resistant and carrier-selective high-resistance film is a $Sb_2S_3$ film having a thickness ranging from 0.05 $\mu$m to 10 $\mu$m.

According to an embodiment (hereunder referred to as a fourth radiation detector of the invention) of the first radiation detector of the invention, the high-withstand-voltage hardening synthetic resin is an epoxy resin.

According to an embodiment (hereunder referred to as a fifth radiation detector of the invention) of the first radiation detector of the invention, the auxiliary plate member includes a material containing elements, each of which has an atomic number of 15 or more and the total content of which is 1 atomic % or less.

According to an embodiment (hereunder referred to as a sixth radiation detector of the invention) of the first radiation detector of the invention, the auxiliary plate member has a structure in which a thickness of a part thereof located in a radiation sensitive region is less than that of a part thereof located in an insensitive region.

According to an embodiment (hereunder referred to as a seventh radiation detector of the invention) of the first radiation detector of the invention, the auxiliary plate member has a structure in which only a part thereof located in a radiation sensitive region is opened.

An embodiment (hereunder referred to as an eighth radiation detector of the invention) of the first or second radiation detector of the invention further comprises a spacer for adjusting a gap between the auxiliary plate member and the insulating substrate.

According to an embodiment (hereunder referred to as a ninth radiation detector of the invention) of the eighth radiation detector of the invention, the gap between the insulating substrate and the auxiliary plate member ranges from 2 mm to 4 mm.

Next, an operation of each of the radiation detectors of the invention is described hereinbelow.

In the case that the radiation detection is performed by the radiation detector of the invention, radiation to be detected is incident on the detector while the bias voltage is applied to the voltage application electrode formed on the front surface side of he radiation sensitive type amorphous semiconductor thick film. The charge transfer media (that is, carriers) generated in the amorphous semiconductor thick film by the incidence of the radiation are moved by the bias voltage to the voltage application electrode and the carrier collection electrode. Then, electric charge is stored in the charge storage capacitor electrically connected to the carrier collection electrode according to the generated carriers. Moreover, as the transition of the state of the charge reading switching element to an ON-state is performed, the stored charge is read as the radiation detection signal through the switching element.

Furthermore, in the case of the radiation detector of the invention, the solvent-resistant and carrier-selective high-resistance film is formed between the amorphous semiconductor thick film and the voltage application electrode in such a manner as to cover the entire surface of the amorphous semiconductor thick film. Thus, the phenomena, in which the surface of the amorphous semiconductor thick film is deteriorated by the solvent ingredient of the high-withstand-voltage hardening synthetic resin, and in which a creeping discharge occurs and the withstand voltage lowers, do not occur. Furthermore, increase in dark current is suppressed.

Moreover, the insulating auxiliary plate member is formed on and fixed to the top layer surface, on which the amorphous semiconductor thick film, the solvent-resistant and carrier-selective high-resistance film, and the voltage application electrode are formed, and fixed thereto by the high-withstand-voltage hardening synthetic resin in such a way as to cover the top layer surface. Thus, the amorphous semiconductor thick film, the solvent-resistant and carrier-selective high-resistance film, and the voltage application electrode, which are relatively inferior in tensile strength, are sandwiched by the insulating plate members that are nearly equal in thermal expansion coefficient to each other. Consequently, the frequency of occurrences of warpage of the amorphous semiconductor thick film owing to change in temperature and that of occurrences of cracks therein are sharply decreased.

Further, a path on which dielectric breakdown other than the breakdown of the amorphous semiconductor thick film itself is assumed to occur, is that extending through the high-withstand-voltage hardening synthetic resin film along the interface between the high-withstand-voltage hardening synthetic resin film and the auxiliary plate member to the part in which the read lines, the gate lines and the ground lines are exposed on the insulating substrate, and that extending to apart in which the recombination of the charge carrier caused by the voltage application electrode and electric charge produced on the auxiliary plate member. Thus, an occurrence of dielectric breakdown is prevented by forming the high-withstand-voltage hardening synthetic resin in such a way as to have a thickness, which is sufficiently thick to the extent that no dielectric breakdown is caused by the bias voltage.

Moreover, the insulating auxiliary plate member is formed on and fixed to the surface of the top layer, in which the amorphous semiconductor thick film, the solvent-resistant and carrier-selective high-resistance film, and the voltage application electrode are formed, and fixed thereto by the high-withstand-voltage hardening synthetic resin in such a way as to cover the top layer surface. This structure serves as a protective film for the amorphous semiconductor thick film that is relatively inferior in the environment resistance.

Further, in the case of the second radiation detector of the invention, a two-dimensional array structure, in which the radiation detection units are arranged in a matrix-like form, is formed by providing a charge storage capacitor and a charge reading switching element correspondingly to each of the plural carrier collection electrodes arranged in a two-dimensional matrix-like form. Thus, local radiation detection is performed in each of the radiation detection units.

In the case of the third radiation detector of the invention, the solvent-resistant and carrier-selective high-resistance film is a $Sb_2S_3$ film having a thickness ranging from 0.05 $\mu$m to 10 $\mu$m. The third radiation detector of the invention performs both of an operation of preventing the surface of the amorphous semiconductor thick film from being deteriorated by the solvent ingredient of the high-withstand-voltage hardening synthetic resin, and of preventing an occurrence of the creeping discharge and the lowering of the withstand voltage, and another operation of preventing increase in dark current.

In the case of the fourth radiation detector of the invention, the high-withstand-voltage hardening synthetic resin is an epoxy resin. Thus, the fourth radiation detector of the invention features that this resin is superior in strength thereof after the hardening, whereas the reactiveness of the solvent ingredient of the resin to the amorphous semiconductor film is low.

In the case of the fifth radiation detector of the invention, the auxiliary plate member is constituted by a material containing elements, each of which has an atomic number of 15 or more and the total content of which is 1 atomic % or less. Thus, the attenuation of the incident radiation can be suppressed.

In the case of the sixth radiation detector of the invention, the auxiliary plate member has a structure in which a thickness of a part thereof located in a radiation sensitive region is less than that of apart thereof located in an insensitive region. Thus, the attenuation of the incident radiation can be suppressed still more by simultaneously maintaining the strength against the warpage of the amorphous semiconductor thick film, which is caused owing to change in temperature, and against cracks occurring therein.

In the case of the seventh radiation detector of the invention, only a part thereof located in a radiation sensitive region is opened. Thus, the attenuation of the incident radiation can be minimized by simultaneously maintaining the strength against the warpage of the amorphous semiconductor thick film, which is caused owing to change in temperature, and against cracks occurring therein.

In the case of the eighth radiation detector of the invention, the spacer for adjusting the bonding gap between the auxiliary plate member and the insulating substrate is provided at a peripheral portion of the auxiliary plate member. This facilitates the control of the bonding gap. Moreover, variation in sensitivity due to variation in attenuation of the incident radiation can be suppressed.

In the case of the ninth radiation detector of the invention, the bonding gap between the insulating substrate and the auxiliary plate member is set to be more than or equal to 2 mm. Thus, among the paths on which dielectric breakdown other than the breakdown of the amorphous semiconductor thick film itself is assumed to occur, it is possible to lengthen the path extending through the high-withstand-voltage hardening synthetic resin film along the interface between the high-withstand-voltage hardening synthetic resin film and the auxiliary plate member to the part in which the read lines, the gate lines and the ground lines are exposed on the insulating substrate, and to lengthen the distance between the voltage application electrode and the auxiliary plate member so that the amount of electric charge, which the surface of the insulating plate member bears, is reduced Thus, a high withstand voltage, which is equal to or higher than 30 kV, can be obtained. Further, the bonding gap is set to be equal to or less than 4 mm. Consequently, the attenuation of the incident radiation owing to the hardening synthetic resin can be minimized.

DETAILED DESCRIPTION OF THE INVENTION

Figure 1:
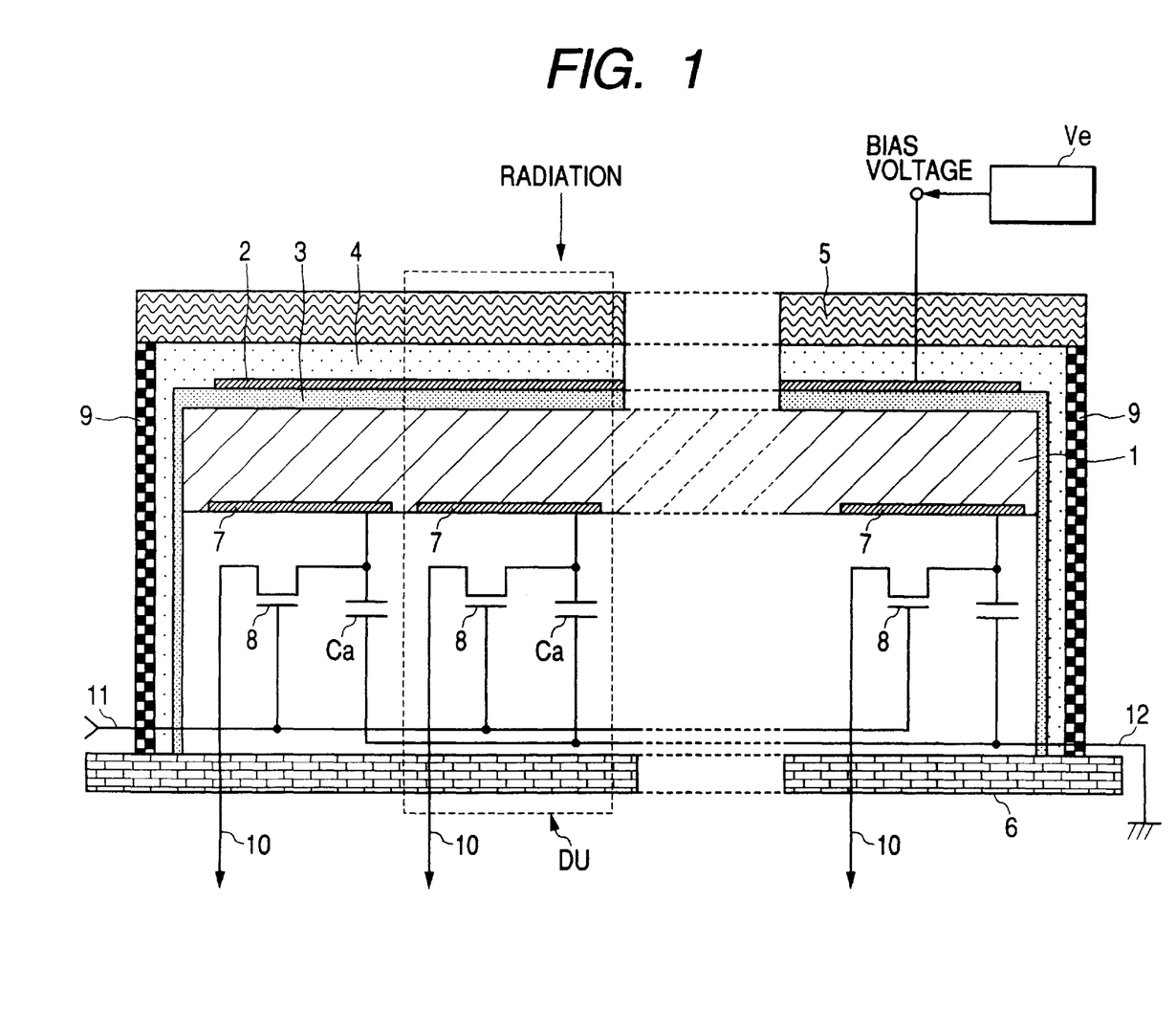
FIG. 1 is a schematic sectional view illustrating the configuration of a radiation sensor portion that is an embodiment of the invention.
Figure 2:
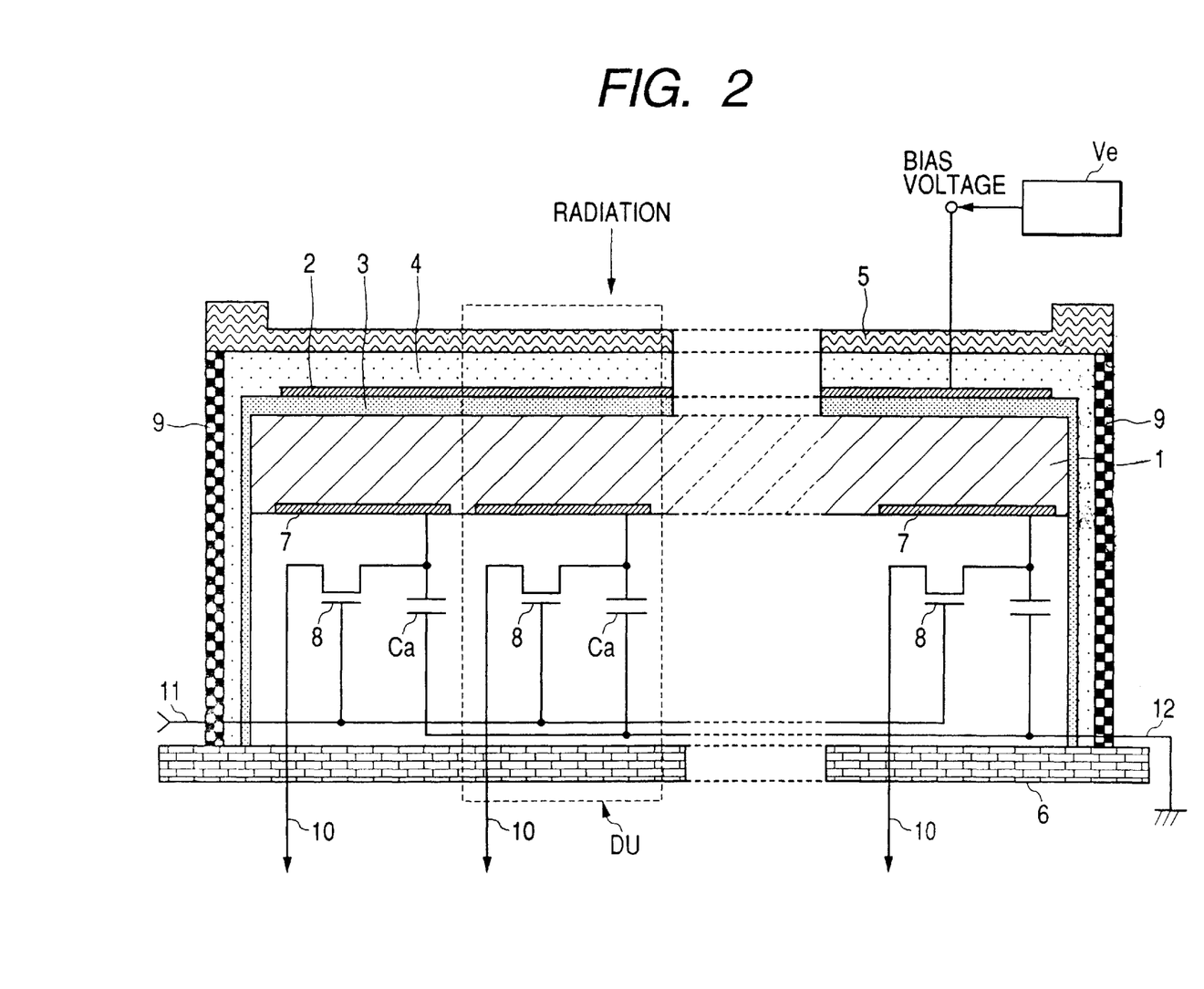
FIG. 2 is a schematic sectional view illustrating the configuration of a radiation sensor portion that is a first modification of the embodiment of the invention.
Figure 3:
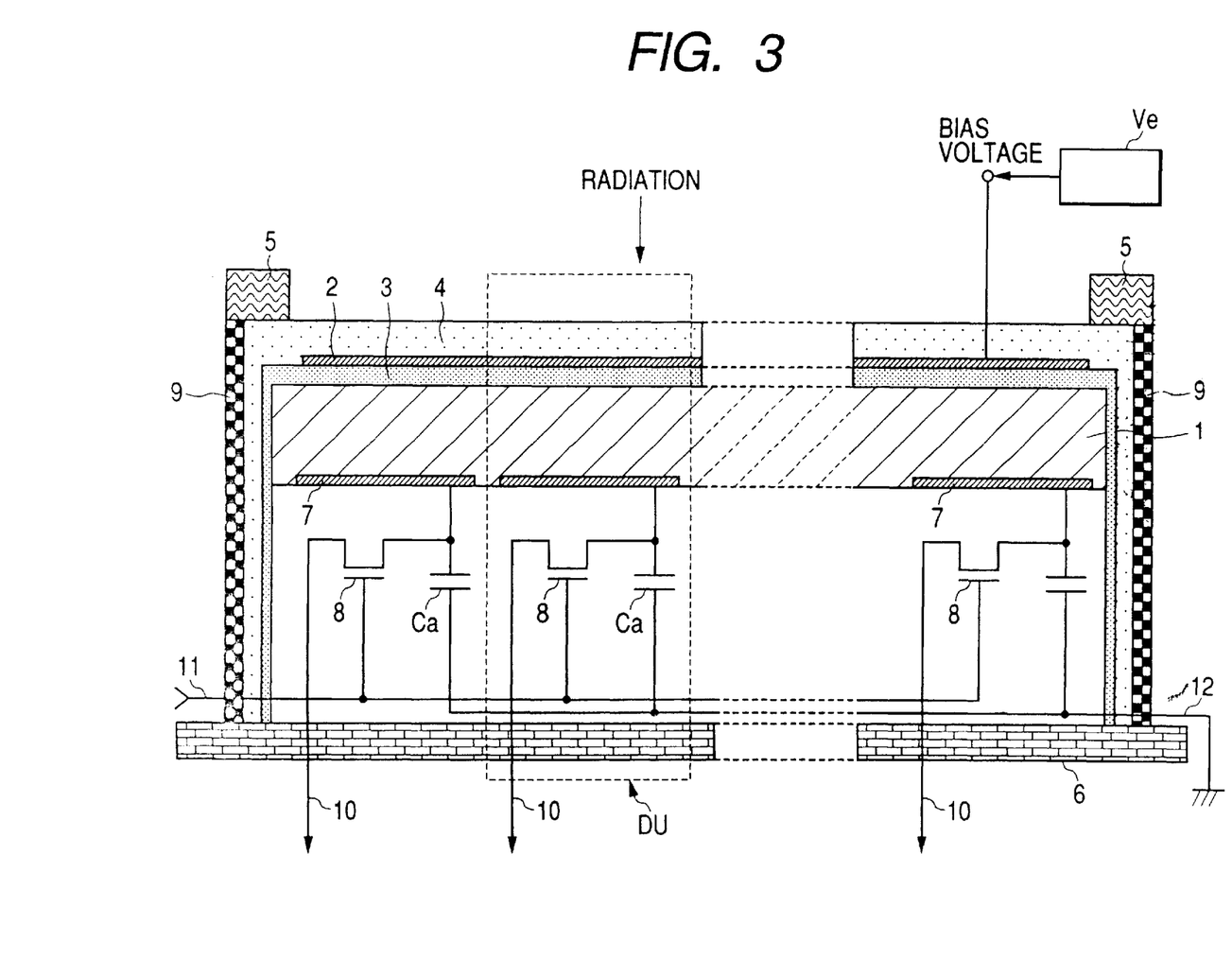
FIG. 3 is a schematic sectional view illustrating the configuration of a radiation sensor portion that is a second modification of the embodiment of the invention.
Figure 4:
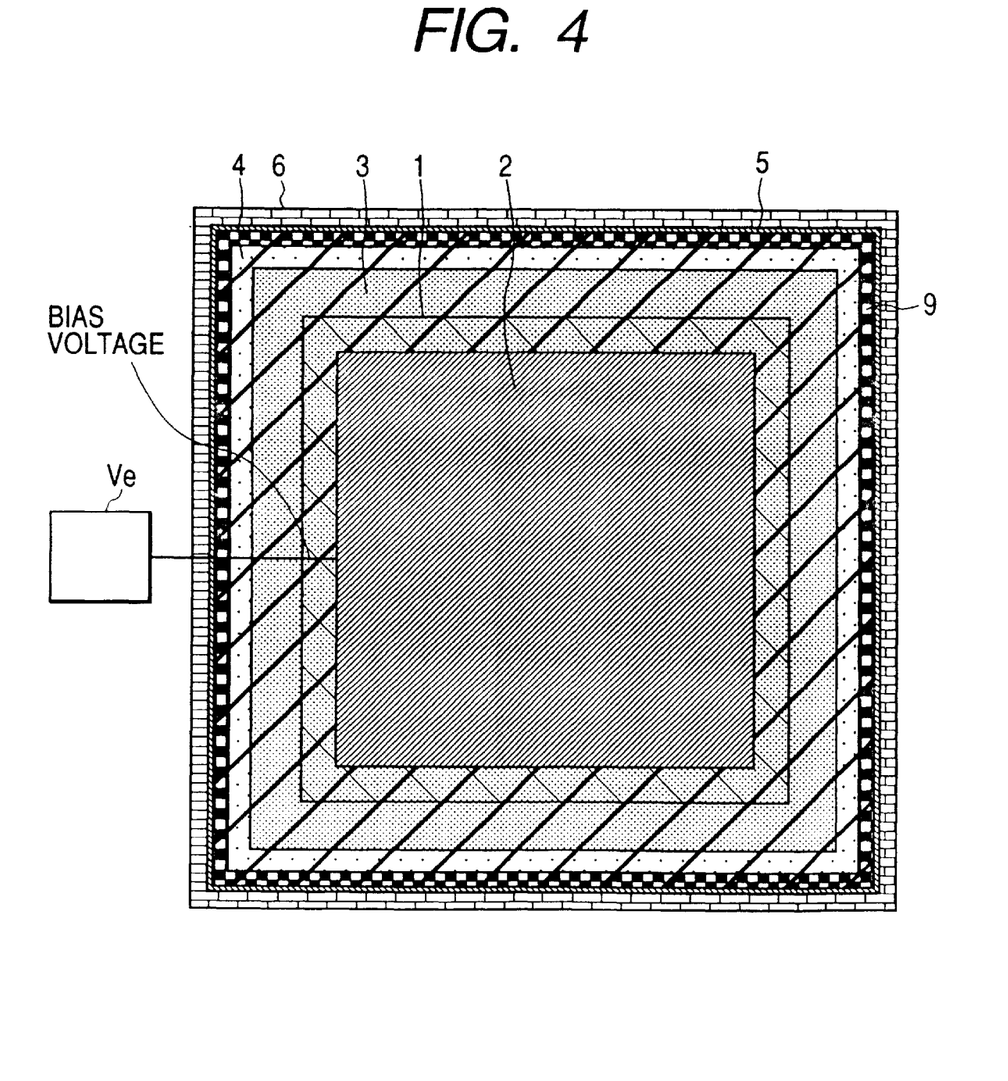
FIG. 4 is a plan view illustrating the configuration of a radiation sensor portion that is the embodiment of the invention.
Figure 5:
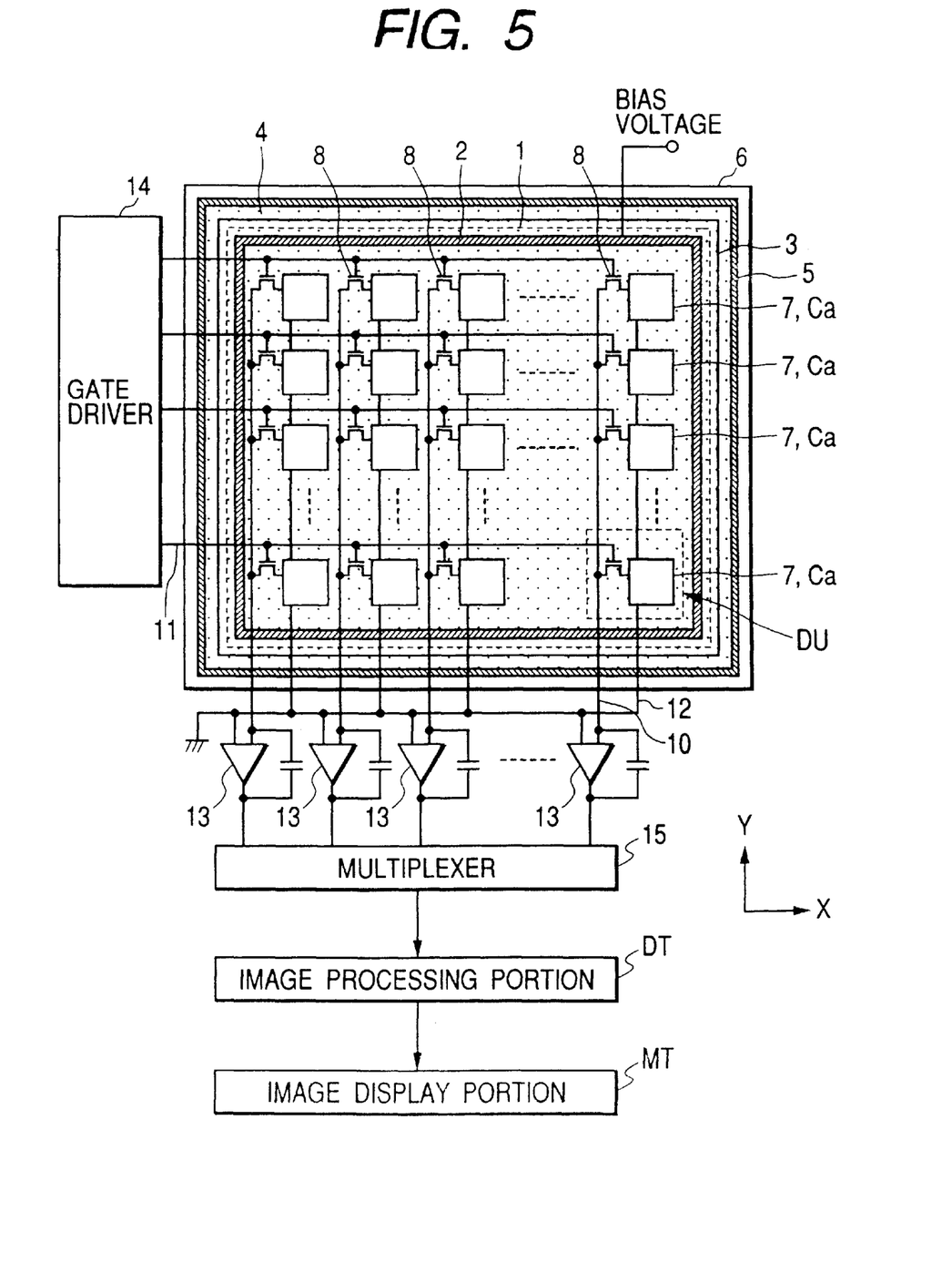
FIG. 5 is a block view illustrating the entire configuration of a radiation detector that is an embodiment of the invention.
Figure 6:
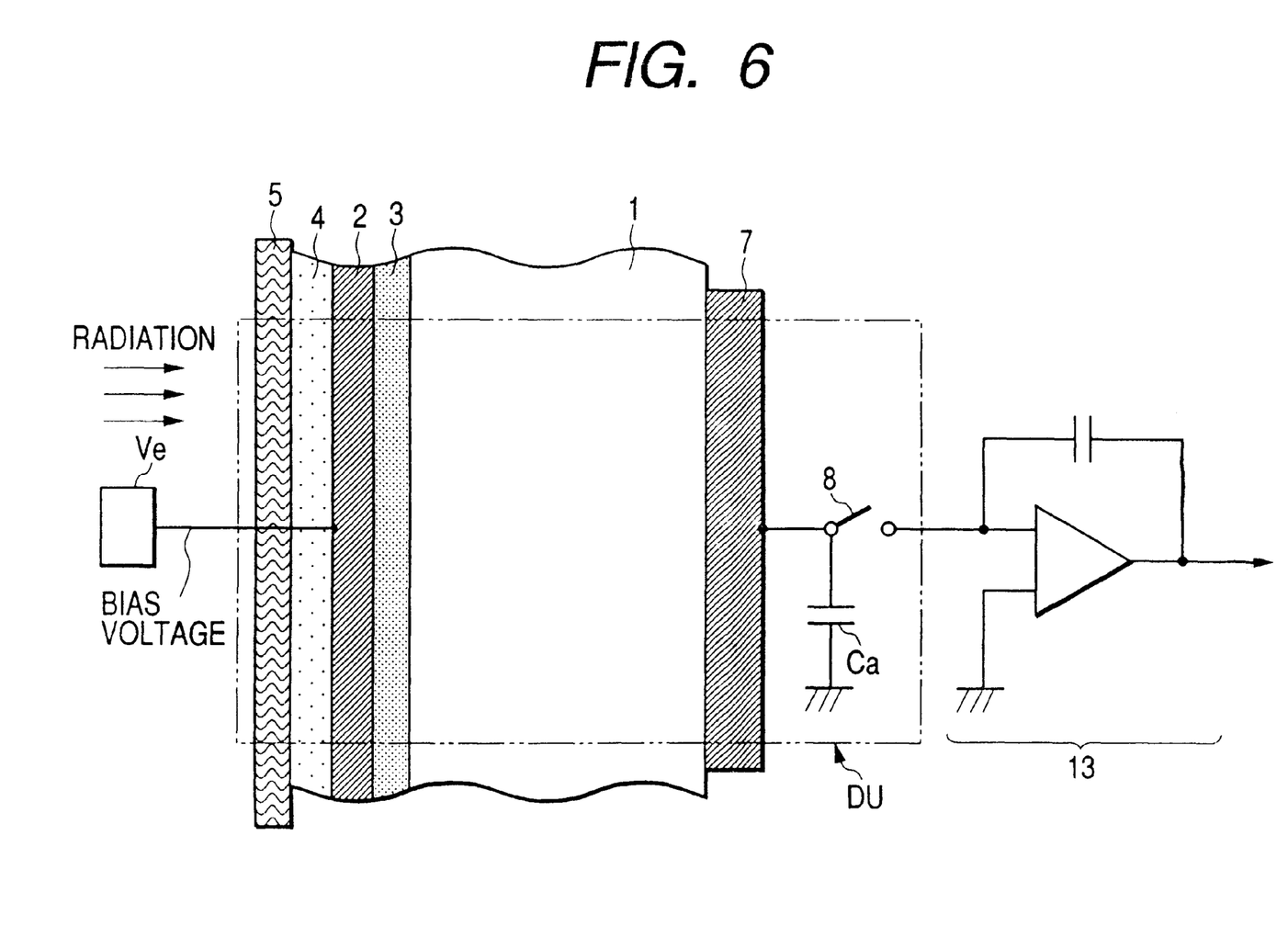
FIG. 6 is an explanatory view illustrating a situation of a detection operation of a radiation detection unit that is an embodiment of the invention.

An embodiment of the invention is described hereinbelow with reference to the accompanying drawings. FIG. 1 is a schematic sectional view illustrating the configuration of a radiation sensor portion that is an embodiment of the invention. FIG. 2 is a schematic sectional view illustrating the configuration of a radiation sensor portion that is a first modification of the embodiment of the invention. FIG. 3 is a schematic sectional view illustrating the configuration of a radiation sensor portion that is a second modification of the embodiment of the invention. FIG. 4 is a plan view illustrating the configuration of a radiation sensor portion that is the embodiment of the invention. FIG. 5 is a block view illustrating the entire configuration of a radiation detector that is an embodiment of the invention. FIG. 6 is an explanatory view illustrating a situation of a detection operation of a radiation detection unit that is an embodiment of the invention.

As illustrated in FIG. 1, the radiation detector of this embodiment has a radiation sensor portion including an insulating substrate 6, such as a glass substrate, an amorphous semiconductor thick film 1, and a voltage application electrode 2. The insulating substrate 6 has capacitors Ca and charge-extracting switching elements 8 formed thereon. The capacitor Ca consists of a $SiO_2$ layer. The charge-extracting switching elements 8 are such as transistors (TFTs), each of which is used for extracting charges stored in the capacitor Ca and usually put in an OFF-state (that is, an interrupted state). The amorphous semiconductor thick film 1 is electrically connected to the charge storage capacitor Ca and formed on the insulating substrate 6 through a carrier collection electrode 7. The voltage application electrode 2 is provided on the radiation-incidence-side (front surface) of the amorphous semiconductor thick film 1. The amorphous semiconductor thick film 1 generates charge transfer media (that is, carriers) therein by incidence of radiation.

Further, the radiation detector according to this embodiment has a bias voltage supply portion (that is, a power supply portion) Ve for supplying a bias voltage to the voltage application electrode 2. When radiation is irradiated during state in which the bias voltage is applied to the voltage application electrode 2, carriers generated by the radiation irradiation are transferred from the carrier collection electrode 7 to the capacitor Ca and then stored therein. Moreover, at a reading time, an ON-signal is sent from a gate line 11 to the switching element 8, so that the switching element 8 is turned on (that is, connected). Thus, the stored charge is read as a radiation detection signal from a read line 10. Hereinafter, the configuration of each of the constituent portions is concretely described.

In the case of the radiation detector according to this embodiment, the amorphous semiconductor thick film 1 has a specific resistance that is equal to or more than $10^9$ Ωcm (preferably, equal to or more than $10^{11}$ Ωcm), and is a high-purity amorphous selenium (a-Se) thick film having a thickness ranging from about 0.5 mm to about 1.5 mm. This a-Se thick film is superior in, especially, adapt for increasing the area of a detection area. A somewhat thick film having a thickness ranging from about 0.5 mm to about 1.5 mm is used as the amorphous semiconductor thick film 1, because the radiation passes through this film without being absorbed and this film cannot sufficiently absorb radiation in the case that this film is thin.

The voltage application electrode 2 and the carrier collection electrode 7 are made of suitable metals selected from a group of Au, Pt, Ni, and In or of ITO (indium tin oxide) Needless to say, the materials of the amorphous semiconductor thick film and the electrodes are not limited to those exemplified hereinabove.

Further, in the radiation detector according to this embodiment, as illustrated in FIG. 1, a solvent-resistant and carrier-selective high-withstand-resistance film 3 is formed between the amorphous semiconductor thick film 1 and the voltage application electrode 2 in such a way as to cover the entire surface of the amorphous semiconductor thick film 1. The high-withstand-resistance film 3 is a $Sb_2S_3$ film for example and has a thickness of about 1 μm. Moreover, the voltage application electrode 2 is formed on the $Sb_2S_3$ film. An insulating auxiliary plate member 5 is fixed to and formed on the surface of the top layer of these by an epoxy rein 4, which is a high-withstand-voltage hardening synthetic resin, in such a way as to cover the surface of the top layer. The insulating auxiliary plate member 5 has a thermal expansion coefficient, which is comparable to that of the insulating substrate 6.

Incidentally, in the case of using the carrier-selective high-resistance film at a positive bias, an n-type (that is, a hole injection preventing type) selection film is used. Conversely, in the case of using the carrier-selective high-resistance film at a negative bias, a p-type (that is, an electron injection preventing type) selection film is used.

The auxiliary plate member 5 having a thermal expansion coefficient, which is comparable to that of the insulating substrate 6, is constituted by a material containing elements, each of which has an atomic number of 15 or more and the total content of which is 1 atomic % or less. As long as the attenuation of radiation is small, any material may be employed. For example, pyrex glass or silica glass can be cited. The preferable thickness of the auxiliary plate member is about 0.5 mm to about 1.5 mm.

Further, as shown in FIG. 2, an auxiliary plate member 5 as a second modification of the embodiment has such a structure in which the thickness of a portion located in a radiation sensitive region is less than that of a portion located in an insensitive region. Therefore, with the structure as shown in FIG. 2, even in the case that the attenuation of radiation is relatively large when a material of the auxiliary plate member 5 is used, the attenuation of the radiation can be suppressed while the strength is maintained. Moreover, as shown in FIG. 3, an auxiliary plate member 5 as a second modification of the embodiment has such a structure in which only a portion located in the radiation sensitive region is opened. Therefore, the attenuation of radiation can be minimized by employing the structure as shown in FIG. 3.

Incidentally, the insulating auxiliary plate member 5 having a thermal expansion coefficient, which is comparable to that of the insulating substrate 6, is not limited to the member 5 implemented in the aforementioned manner. Any auxiliary member may be employed as long as the auxiliary member is formed so that no warpage occurs in the amorphous semiconductor thick film 1.

The $Sb_2S_3$ film is cited as an example of the solvent-resistant and carrier-selective high-resistance film 3 of the radiation detectors according to this embodiment, the first modification thereof and the second modification thereof. However, films made of inorganic semiconductors, such as CdS, SbTe, ZnTe, and CdTe, and films made of organic film materials, such as polycarbonate, to which a carrier mobility material is added, may be used other than the $Sb_2S_3$ film. The thickness of these films depends upon the carrier selectivity, the solvent-resistance, and the adhesion to the amorphous semiconductor thick film 1, and is, preferably, 0.01 μm to 10 μm. Alternatively, the thickness of these films maybe selected within a range from 0.05 μm to 10 μm.

Although an epoxy resin has been cited as an example of the high-withstand-voltage hardening synthetic resin 4, other materials, such as an acrylic resin and a fluororesin, may be used as long as the reactivity between the solvent ingredient of the resin and the amorphous semiconductor thick film 1 is small. Incidentally, when the a-Se film is used as the amorphous semiconductor thick film, there is the necessity for selecting a resin of the type that hardens at room temperature, because the a-Se film is liable to be deformed by heat. When a forming thickness, at which these resins are formed, is too small, the withstand voltage lowers. Conversely, when the forming thickness is too large, the incident radiation attenuates. Thus, preferably, the gap between the insulating substrate 6 and the insulating auxiliary plate member 5 ranges from 1 mm to 5 mm. Possibly, it is desirable that the gap therebetween ranges from 2 mm to 4 mm.

To reliably form such a gap, a spacer 9 made of ABS resin is provided in the peripheral portion of the insulating substrate 6 in the radiation detector of this embodiment illustrated in FIG. 1, the first modification of this embodiment shown in FIG. 2, and the second modification of this embodiment shown in FIG. 3 so as to easily adjust the value of this gap.

Further, in the radiation sensor portion of the detector according to this embodiment, a large number of carrier collection electrodes 7 are formed and arranged in a two-dimensional matrix-like form, as illustrated in FIGS. 1, 4, and 5. Moreover, one of the charge storage capacitors Ca and one of the charge reading switching elements 8 are provided correspondingly to each of the carrier collection electrodes 7. This is configured as a flat panel type radiation sensor (that is, a surface sensor) of a two-dimensional array structure in which a large number (for example, 1024×1024) of detecting elements DU each serving as a radiation detection unit are arranged along X-direction and Y-direction. Incidentally, FIG. 4 is a plan view illustrating the radiation sensor portion shown in FIG. 1. FIG. 5 is a schematic view illustrating the inner structure thereof.

That is, as illustrated in FIG. 5, the voltage application electrode 2 serving as common electrodes for all the detecting elements DU are formed on the entire surface. The carrier collection electrodes 7 serving as individual detecting elements are arranged in a two-dimensional matrix-like form correspondingly to each of the detecting elements DU in such a way as to be separated from the carrier collection electrodes corresponding to other detecting elements DU. Moreover, one of the charge storage capacitors Ca and one of the charge reading switching elements 8 are connected to each of the carrier collection electrodes 7, so that local radiation detection is performed in each of the radiation detection units. This enables measurement of the two-dimensional distribution of radiation intensity.

Further, as illustrated in FIG. 5, in the radiation sensor portion of this embodiment, the gate of a thin film transistor for the switching element 8 of the detecting element DU is connected to the gate line 11 extending in a lateral direction (that is, X-direction). The source thereof is connected to the read line 10 extending in the longitudinal direction (that is, Y-direction). The read lines 10 are connected to the multiplexer 15 through a charge-voltage converter group (that is, a preamplifier group) 13. The gate lines 11 are connected to the gate driver 14. Incidentally, in this embodiment, the charge-voltage converters 13 are respectively connected to the read lines 10 in a one-to-one correspondence relation.

Further, in the case of the radiation sensor portion of the radiation detector according to this embodiment, scan signals for extracting signals to the multiplexer 15 and the gate driver 14 are sent thereto. Each of the detecting elements DU of the radiation sensor portion is specified according to addresses (for instance, 0 to 1023) sequentially assigned to the detecting elements DU along the arrangement corresponding to each of the X-direction and the Y-direction. Thus, the extracting scan signals are used for designating X-direction addresses and Y-direction addresses.

As extracting voltages are applied from the gate driver 14 to the X-direction gate lines 11 line by line according to the scan signals corresponding to the Y-direction, so that the detecting elements DU corresponding to each line are selected at a time. Further, the multiplexer 15 is switched to another according to the X-direction scan signal. Thus, the charges stored in the capacitors Ca of the detecting element DU corresponding to the selected line are outputted to an external circuit sequentially through a group of charge-voltage converter groups 13 . . . 13 and the multiplexer 15.

When the radiation detector of this embodiment is used as, for example, an X-ray detector of an X-ray fluoroscopic imaging system, detection signals of the detecting elements DU are serially extracted from the multiplexer 15 as pixel signals. Then, necessary signal processing, such as noise processing, is performed in an image processing portion DT. Subsequently, the processed signals are displayed as a two-dimensional image (that is, an X-ray fluoroscopic image) in an image display portion MT.

As is understood from the foregoing description, the system of extracting detection signals from the radiation sensor portion of this embodiment has a configuration that is almost similar to that of video equipment, such as an ordinary TV camera. In the case of this embodiment, the charge-voltage converter group 13, the multiplexer 15, and the gate driver 14, and, if necessary, the AD converter (not shown) are provided in the radiation sensor portion. The further integration of the radiation sensor portion is achieved. However, all or part of the charge-voltage converter group 13, the multiplexer 15, the gate driver 14 and the AD converter may be separately provided.

Further, in the case of manufacturing the radiation sensor portion of this embodiment, thin film transistors for use in the switching elements 8, the capacitors Ca, the carrier collection electrodes 7, the amorphous semiconductor thick film 1, and the carrier selective high resistance film 3, and the voltage application electrode 2 are formed by being sequentially superimposed on the surface of the insulating substrate 6 by utilizing the thin film formation techniques based on various kinds of vacuum film formation methods and also utilizing patterning techniques based on a photolithography method.

Next, a radiation detecting operation of the radiation detector according to this embodiment is described hereinbelow with reference to FIG. 6. In the case of performing radiation detection by the detector of this embodiment, as illustrated in FIG. 6, radiation to be detected is caused to incident upon the radiation detector during a state in which a bias voltage is applied to the voltage application electrode 2 on the front surface side of the amorphous semiconductor thick film 1. Electrons and holes serving as the charge transfer media (that is, carriers) are generated by incidence of radiation and respectively moved by the bias voltage to the voltage application voltage 2 and the carrier collection electrode 7. Then, electric charges are stored in the charge storage capacitor Ca at the side of the carrier collection electrode 7 according to the number of the generated carriers. Moreover, as the transition of the state of the charge reading switch elements 8 into the ON-state is performed, the stored charge is read through the switching element 8 as a radiation detection signal. Thereafter, the charge-voltage converter 13 converts the read charges into voltage signals.

Furthermore, in the case of the radiation detector of this embodiment, the solvent-resistant and carrier-selective high-resistance film 3 is formed between the amorphous semiconductor thick film 1 and the voltage application electrode 2 in such a manner as to cover the entire surface of the amorphous semiconductor thick film 1. Thus, the phenomena, in which the surface of the amorphous semiconductor thick film 1 is deteriorated by the solvent ingredient of the high-withstand-voltage hardening synthetic resin 4, and in which the creeping discharge occurs and the withstand voltage lowers, do not occur.

Moreover, the insulating auxiliary plate member 5, which has a thermal expansion coefficient comparable to that of the insulating substrate 6, is formed on and fixed to the top layer surface, on which the amorphous semiconductor thick film 1, the solvent-resistant and carrier-selective high-resistance film 3, and the voltage application electrode 2 are formed, and fixed thereto by the high-withstand-voltage hardening synthetic resin 4 in such away as to cover the top layer surface. Thus, the amorphous semiconductor thick film 1, the solvent-resistant and carrier-selective high-resistance film 3, and the voltage application electrode 2, which are relatively inferior in tensile strength, are sandwiched by the insulating auxiliary plate members 5 that are nearly equal in thermal expansion coefficient to each other. Consequently, the frequency of occurrences of warpage of the amorphous semiconductor thick film 1 owing to change in temperature and that of occurrences of cracks therein are sharply decreased.

Further, a path on which dielectric breakdown other than the breakdown of the amorphous semiconductor thick film 1 itself is assumed to occur, is only that extending through the high-withstand-voltage hardening synthetic resin film 4 along the interface between the high-withstand-voltage hardening synthetic resin film 4 and the auxiliary plate member 5 to the part in which the read lines 10, the gate lines 11 and the ground lines 12 are exposed on the insulating substrate 6, and that extending to a part in which the recombination of the charge carrier caused by the voltage application electrode and electric charge produced on the auxiliary plate 5. Thus, an occurrence of dielectric breakdown is prevented by forming the high-withstand-voltage hardening synthetic resin 4 in such a way as to have a thickness, which is sufficiently thick to the extent that no dielectric breakdown is caused by the bias voltage.

Moreover, the insulating auxiliary plate member 5, which has a thermal expansion coefficient comparable to the insulating substrate 6, is formed on and fixed to the surface of the top layer, in which the amorphous semiconductor thick film 1, the solvent-resistant and carrier-selective high-resistance film 3, and the voltage application electrode 2 are formed, and fixed thereto by the high-withstand-voltage hardening synthetic resin 4 in such a way as to cover the top layer surface. This structure serves as a protective film for the amorphous semiconductor thick film that is relatively inferior in the environment resistance.

EXAMPLE

Next, to actually ascertain that the withstand voltage is enhanced without deteriorating the surface of the amorphous semiconductor thick film 1 by the solvent ingredient of the high-withstand-voltage hardening synthetic resin 4, a testing radiation detector having a configuration, which was the same as that of the radiation detector of this embodiment was manufactured.

That is, the amorphous semiconductor thick film 1 was an a-Se film, which was 1 mm in thickness. The solvent-resistant and carrier selective high-resistance film 3 was a $Sb_2S_3$ film, which was about 0.3 $\mu$m. The high-withstand-voltage hardening synthetic resin 4 was an epoxy resin. The insulating auxiliary plate member 5 having a thermal expansion coefficient comparable to the insulating substrate 6 was pyrex glass that was 0.7 mm in thickness. The ABS resin spacer 9 was provided so that the width of the gap between the insulating substrate 6 and the pyrex glass (that is, the auxiliary plate member 5) was 3 mm.

On the other hand, two comparative radiation detectors were manufactured. That is, one was a first comparative radiation detector of a configuration, which was similar to that of the testing radiation detector except that the first comparative radiation detector was provided with no $Sb_2S_3$ film (that is, no high-resistance film 3). The other was a second comparative radiation detector of a configuration, which was similar to that of the testing radiation detector except that only an epoxy resin layer was formed on the surface of the top layer without using pyrex glass (that is, the auxiliary plate member 5).

Then, a bias voltage of 4 kV was applied to the voltage application electrodes 2 of the three radiation detectors, that is, the testing radiation detector, the first comparative radiation detector, and the second comparative radiation detector. The application of the bias voltage thereto was continued for 1 minute. During the irradiation of the radiation (the X-ray) was continued for 10 seconds, detection outputs (that is, current values outputted) from the read lines 10 of these detectors were measured. At that time, to enhance the measurement accuracy, normally-ON-signals were provided to all the gate lines 11 thereof to thereby bring the switching elements 8 into a normally ON-state, so that normally detection outputs were sent to the read lines 10. Subsequently, similar measurement operations were repeated by increasing the bias voltage in increments of 1 kV. In the case of the testing radiation detector, such measurement was performed until the bias voltage reaches 30 kV. In the case of the comparative radiation detectors, such measurement was performed until dielectric breakdown occurred. FIG. 7 shows results of the measurement.

In the case of the testing radiation detector and the second comparative radiation detector, which did not use the pyrex glass (that is, the auxiliary plate member 5), no dielectric breakdown did not occur even when the bias voltage of 30 kV was applied thereto. In contrast, in the case of the first comparative radiation detector, which did not use the $Sb_2S_3$ film (that is, the high-resistance-film 3), dielectric breakdown occurred at 5 kV. Actually, the reaction of the surface of the a-Se film of the first comparative detector and the solvent ingredient of the epoxy resin 4 proceeds. Thus, the surface of the a-Se film turned red.

As is understood from this, a high withstand voltage of 30 kV or more can be obtained when the solvent-resistant and carrier-selective high-resistance film 3 is formed between the amorphous semiconductor thick film 1 and the voltage application electrode 2 in such a way as to cover the entire surface of the amorphous semiconductor thick film 1 and as to have a thickness sufficient to the extent that the surface of the amorphous semiconductor thick film is prevented from being deteriorated by the solvent ingredient of the high-withstand-voltage hardening synthetic resin 4, similarly as the radiation detector of this embodiment.

Subsequently, after the testing radiation detector and the second comparative radiation detector, which did not use the pyrex glass 5, were left in a thermostatic oven at 40° C. for 100 hours, the temperature was put back to room temperature and then the same testing was preformed for the testing radiation detector and the second comparative radiation detector.

Even when the bias voltage of 30 kV was applied thereto, dielectric breakdown did not occur in the testing radiation detector. The value of a signal current was nearly equal to that before left therein at 40° C. Conversely, in the case of the second comparative radiation detector, the value of the signal current abruptly increases, so that dielectric breakdown occurred at a bias voltage of 8 kV. Actually, in the case of the second radiation detector, warpage occurred during left in the thermostatic oven at 40° C. After the temperature was put back to room temperature, cracks occurred in the $Sb_2S_3$ film on the a-Se film.

As is understood from this, occurrences of warpage due to change in ambient temperature in the amorphous semiconductor thick film 1, the solvent-resistant and carrier-selective high-resistance-film 3, and the voltage application electrode 2, and occurrences of cracks therein owing to the warpage can be prevented by forming and fixing the insulating auxiliary plate member 5, which has a thermal expansion coefficient comparable to the insulating substrate 6, onto the surface of the top layer, in which the amorphous semiconductor thick film 1, the solvent-resistant and carrier-selective high-resistance-film 3, and the voltage application electrode 2 are formed, by using the high-withstand-voltage hardening synthetic resin 4 in such a manner as to cover the surface of the top layer, similarly as the radiation detector of this embodiment.

The invention is not limited to the aforementioned embodiments. The following modifications of the invention may be made.

(1) Although the amorphous semiconductor thick film 1 is the high-purity a-Se thick film in the aforementioned embodiments, the amorphous semiconductor thick film 1 according to the invention may be an a-Se thick film doped with As or Te, which has the function of preventing crystallization, or an amorphous semiconductor thick film of a selenium compound.

(2) Further, although no intermediate layer is provided between the carrier collection electrode 7 and the amorphous semiconductor thick film 1 in the aforementioned embodiments, a carrier-selective intermediate layer constituted by a $Sb_2S_3$ film or a selenium compound film.

(3) Moreover, the aforementioned embodiment has a two-dimensional array structure in which a large number of detecting elements DU are arranged in a matrix-like form. A detector having a line-sensor configuration, in which plural detecting elements DU are arranged in only one line or row, or a detector of a configuration in which only one detecting element is provided, may be cited as modifications of the embodiment of the invention.

(4) Incidentally, radiation to be detected by the radiation detectors of the invention is not limited to an X-ray but includes all kinds of radioactive rays.

According to the first radiation detector of the invention, the solvent-resistant and carrier-selective high-resistance film is formed between the radiation sensitive type amorphous semiconductor thick film, which is suitable for producing a large area film, and the voltage application electrode in such a manner as to cover the entire surface of the amorphous semiconductor thick film. Moreover, the insulating auxiliary plate member having a thermal expansion coefficient, which is comparable to that of the insulating substrate, is formed on the surface of the top layer, in which the amorphous semiconductor thick film, the solvent-resistant and carrier-selective high-resistance film, and the voltage application electrode are formed, and fixed thereonto by using the high-withstand-voltage hardening synthetic resin in such a way as to cover the surface of the top layer. Consequently, occurrences of deterioration of the surface of an amorphous semiconductor thick film, warpage due to change in temperature thereof, and dielectric breakdown due to cracks occurring therein are prevented. Furthermore, sufficient detection sensitivity can be obtained by applying a high bias voltage thereto. Moreover, regarding the structure, wherein the insulating auxiliary plate member having a thermal expansion coefficient, which is comparable to that of the insulating substrate, is formed on and fixed to the surface of the top layer, in which the amorphous semiconductor thick film, the solvent-resistant and carrier-selective high-resistance film, and the voltage application electrode are formed, and fixed thereto by the high-withstand-voltage hardening synthetic resin in such a way as to cover the top layer surface. This structure also serves as a protective film for the amorphous semiconductor thick film that is relatively inferior in environment resistance. Consequently, long-term reliability can be ensured.

According to the second radiation detector of the invention, the charge storage capacitor and the charge reading switching element are provided correspondingly to each of the carrier collection electrodes, a large number of which are formed and arranged in a two-dimensional matrix-like form. The second radiation detector is constructed in such a way as to have a two-dimensional array configuration in which radiation detection units are arranged in a matrix-like form. In each of the radiation detection units, local radiation detection can be performed. Thus, high-precision measurement of the two-dimensional distribution of radiation intensity can be performed by applying a high bias voltage to the electrode.

According to the third radiation detector of the invention, the solvent-resistant and carrier-selective high-resistance film is a $Sb_2S_3$ film having a thickness ranging from 0.05 μm to 10 μm. The third radiation detector of the invention has advantageous effects not only in that the surface of the amorphous semiconductor thick film is prevented from being deteriorated by the solvent ingredient of the high-withstand-voltage hardening synthetic resin, but in that increase in dark current can be prevented. Thus, even when a high bias voltage is applied to the electrode, increase in the dark current is small, so that high-sensitive detection characteristics can be obtained.

According to the fourth radiation detector of the invention, the high-withstand-voltage hardening synthetic resin is an epoxy resin. Thus, this resin is superior in strength thereof after the hardening, whereas the reactiveness of the solvent ingredient of the resin to the amorphous semiconductor film is low. Consequently, the environmental resistance is enhanced. The long-term reliability can be obtained.

According to the fifth to seventh radiation detectors, the attenuation of the incident radiation can be minimized. Thus, higher detection sensitivity can be obtained.

According to the eighth and ninth radiation detectors, the bonding gap between the insulating substrate and the insulating auxiliary plate member can be adjusted with good accuracy. Thus, a high withstand voltage, which is equal to or more than 30 kV, can be obtained by simultaneously preventing the attenuation of the incident radiation and an occurrence of variation in sensitivity.

What is claimed is:

1. A radiation detector comprising:
   an insulating substrate having a charge storage capacitor and a charge reading switching element which are formed thereon;
   a carrier collection electrode formed on said insulating substrate and electrically connected to said charge storage capacitor;
   a radiation sensitive type amorphous semiconductor thick film formed on said carrier collection electrode and adapted to generate charge transfer media in response to an incidence of a radiation;
   a voltage application electrode formed on said amorphous semiconductor thick film;
   a solvent-resistant and carrier-selective high-resistance film formed between said amorphous semiconductor thick film and said voltage application electrode in such a manner as to cover the entire surface of said amorphous semiconductor thick film; and
   an insulating auxiliary plate member having a thermal expansion coefficient, which is comparable to that of said insulating substrate, and being formed on said voltage application electrode and fixed thereto by a high-withstand-voltage hardening synthetic resin in such a way as to prevent warpage of said amorphous semiconductor thick film from occurring owing to change in temperature,
   wherein electric charges are stored in said charge storage capacitor according to the number of the charge transfer media generated in said amorphous semiconductor thick film by the incidence of radiation and the electric charges stored in said charge storage capacitor is read as a radiation detection signal through said switching element.

2. The radiation detector according to claim 1, wherein said radiation detector has a two-dimensional array structure in which a plurality of carrier collection electrodes are formed in such a way as to be arranged in a two-dimensional matrix-like manner, and one of charge storage capacitors and one of charge switching elements are provided correspondingly to each of said carrier collection electrodes.

3. The radiation detector according to claim 1, wherein said solvent-resistant and carrier-selective high-resistance film is an $Sb_2S_3$ film having a thickness ranging from 0.01 μm to 10 μm.

4. The radiation detector according to claim 3, wherein said solvent-resistant and carrier-selective high-resistance film is the $Sb_2S_3$ film having a thickness ranging from 0.05 μm to 10 μm.

5. The radiation detector according to claim 1, wherein said high-withstand-voltage hardening synthetic resin is an epoxy resin.

6. The radiation detector according to claim 1, wherein said auxiliary plate member includes a material containing elements, each of which has an atomic number of 15 or more and the total content of which is 1 atomic % or less.

7. The radiation detector according to claim 1, wherein said auxiliary plate member has a structure in which a thickness of a part thereof located in a radiation sensitive region is less than that of a part thereof located in an insensitive region.

8. The radiation detector according to claim 1, wherein said auxiliary plate member has a structure in which only a part thereof located in a radiation sensitive region is opened.

9. The radiation detector according to claim 1, which further comprises:
   a spacer for adjusting a gap between said auxiliary plate member and said insulating substrate.

10. The radiation detector according to claim 9, wherein the gap between said insulating substrate and said auxiliary plate member ranges from 1 mm to 5 mm.

11. The radiation detector according to claim 10, wherein the gap between said insulating substrate and said auxiliary plate member ranges from 2 mm to 4 mm.

12. The radiation detector according to claim 1, wherein said radiation sensitive type amorphous semiconductor thick film has a thickness ranging from 0.5 mm to 1.5 mm.

* * * * *